(12) United States Patent
Leung (10) Patent No.: US 7,447,104 B2
(45) Date of Patent: Nov. 4, 2008

(54) WORD LINE DRIVER FOR DRAM EMBEDDED IN A LOGIC PROCESS

(75) Inventor: Wingyu Leung, Cupertino, CA (US)

(73) Assignee: MoSys, Inc., Sunnyvale, CA (US)

( * ) Notice: Subject to any disclaimer, the term of this patent is extended or adjusted under 35 U.S.C. 154(b) by 0 days.

(21) Appl. No.: 11/559,870

(22) Filed: Nov. 14, 2006

(65) Prior Publication Data

US 2007/0109906 A1    May 17, 2007

Related U.S. Application Data

(62) Division of application No. 11/166,856, filed on Jun. 24, 2005, now Pat. No. 7,274,618.

(51) Int. Cl.
| | |
|---|---|
| *G11C 8/00* | (2006.01) |
| *G11C 7/00* | (2006.01) |
| *G11C 5/14* | (2006.01) |
| *G11C 7/02* | (2006.01) |

(52) U.S. Cl. ............... 365/230.06; 365/189.06; 365/189.09; 365/189.11; 365/206

(58) Field of Classification Search ............ 365/185.23, 365/189.06, 189.09, 189.11, 230.06, 203.06
See application file for complete search history.

(56) References Cited

U.S. PATENT DOCUMENTS

| | | | |
|---|---|---|---|
| 4,330,852 A | 5/1982 | Redwine et al. | |
| 4,446,536 A * | 5/1984 | Rodgers | ........ 365/185.23 |
| 4,549,284 A | 10/1985 | Ikuzaki | |
| 4,625,301 A | 11/1986 | Berger | |
| 4,758,993 A | 7/1988 | Takemae | |
| 4,839,867 A | 6/1989 | Poehnitzsch | |
| 4,999,814 A | 3/1991 | Hashimoto | |

(Continued)

FOREIGN PATENT DOCUMENTS

EP    0 811 979 A2    9/1991

(Continued)

OTHER PUBLICATIONS

Enhanced Memory Systems, Inc. "16Mbit Enhanced SDRAM Family 4Mx4, 2Mx8, 1Mx16," 1997, pp. 1-8.

(Continued)

*Primary Examiner*—Ly D Pham
(74) *Attorney, Agent, or Firm*—E. Eric Hoffman; Bever, Hoffman & Harms, LLP (57) ABSTRACT

A word line driver is provided for accessing a DRAM cell embedded in a conventional logic process. The DRAM cell includes a p-channel access transistor coupled to a cell capacitor. The word line driver includes an n-channel transistor located in a p-well, wherein the p-well is located in a deep n-well. The deep n-well is located in a p-type substrate. A word line couples the drain of the n-channel transistor to the gate of the p-channel access transistor. A negative boosted voltage supply applies a negative boosted voltage to the p-well and the source of the n-channel transistor. The negative boosted voltage is less than ground by an amount equal to or greater than the threshold voltage of the p-channel access transistor. The deep n-well and the p-type substrate are coupled to ground. The various polarities can be reversed in another embodiment.

12 Claims, 5 Drawing Sheets

U.S. PATENT DOCUMENTS

| | | | |
|---|---|---|---|
| 5,033,027 A | 7/1991 | Amin | |
| 5,193,072 A | 3/1993 | Frenkil et al. | |
| 5,295,109 A | 3/1994 | Nawaki | |
| 5,365,479 A * | 11/1994 | Hoang et al. | 365/189.09 |
| 5,450,364 A | 9/1995 | Stephens, Jr. et al. | |
| 5,471,601 A | 11/1995 | Gonzales | |
| 5,511,033 A | 4/1996 | Jung | |
| 5,544,120 A | 8/1996 | Kuwagata et al. | |
| 5,559,750 A | 9/1996 | Dosaka et al. | |
| 5,583,823 A | 12/1996 | Park | |
| 5,586,287 A | 12/1996 | Okumura et al. | |
| 5,642,320 A | 6/1997 | Jang | |
| 5,652,729 A | 7/1997 | Iwata et al. | |
| 5,659,515 A | 8/1997 | Matsuo et al. | |
| 5,719,814 A | 2/1998 | Ishikawa | |
| 5,721,862 A | 2/1998 | Sartore et al. | |
| 5,748,547 A | 5/1998 | Shau | |
| 5,784,705 A | 7/1998 | Leung | |
| 5,802,555 A | 9/1998 | Shigeeda | |
| 5,822,252 A * | 10/1998 | Lee et al. | 365/185.3 |
| 5,822,265 A | 10/1998 | Zdenek | |
| 5,829,026 A | 10/1998 | Leung et al. | |
| 5,835,401 A | 11/1998 | Green et al. | |
| 5,846,860 A | 12/1998 | Shih et al. | |
| 5,859,809 A | 1/1999 | Kim | |
| 5,873,114 A | 2/1999 | Rahman et al. | |
| 5,875,452 A | 2/1999 | Katayama et al. | |
| 5,920,225 A | 7/1999 | Choi et al. | |
| 5,940,851 A | 8/1999 | Leung | |
| 5,963,477 A * | 10/1999 | Hung | 365/185.22 |
| 5,999,474 A | 12/1999 | Leung et al. | |
| 6,028,804 A | 2/2000 | Leung | |
| 6,031,779 A * | 2/2000 | Takahashi et al. | 365/226 |
| 6,043,536 A | 3/2000 | Numata et al. | |
| 6,075,740 A | 6/2000 | Leung | |
| 6,088,267 A * | 7/2000 | Atsumi et al. | 365/185.23 |
| 6,147,914 A | 11/2000 | Leung et al. | |
| 6,166,987 A * | 12/2000 | Atsumi et al. | 365/230.06 |
| 6,187,618 B1 | 2/2001 | Kao et al. | |
| 6,195,303 B1 | 2/2001 | Zheng | |
| 6,222,785 B1 | 4/2001 | Leung | |
| 6,259,651 B1 | 7/2001 | Leung | |
| 6,282,606 B1 | 8/2001 | Holland | |
| 6,366,989 B1 | 4/2002 | Keskar et al. | |
| 6,452,852 B2 | 9/2002 | Bohm | |
| 6,455,901 B2 | 9/2002 | Kameyama et al. | |
| 6,473,344 B2 * | 10/2002 | Kim et al. | 365/189.09 |
| 6,493,268 B1 * | 12/2002 | Khouri et al. | 365/185.23 |
| 6,496,034 B2 | 12/2002 | Forbes et al. | |
| 6,496,437 B2 | 12/2002 | Leung | |
| 6,504,780 B2 | 1/2003 | Leung | |
| 6,549,465 B2 * | 4/2003 | Hirano et al. | 365/185.23 |
| 6,600,186 B1 | 7/2003 | Lee et al. | |
| 6,661,699 B1 | 12/2003 | Walker | |
| 6,718,431 B2 * | 4/2004 | Barth et al. | 365/194 |
| 6,865,114 B2 * | 3/2005 | Pio | 365/185.29 |
| 6,930,927 B2 * | 8/2005 | Pascucci | 365/185.29 |
| 6,940,759 B2 * | 9/2005 | Tsang et al. | 365/185.29 |
| RE38,944 E * | 1/2006 | Takahashi et al. | 365/230.03 |
| 7,020,024 B2 * | 3/2006 | Sim | 365/185.23 |
| 2001/0014045 A1 | 8/2001 | Kitamoto et al. | |
| 2001/0053093 A1 * | 12/2001 | Ogura et al. | 365/185.23 |
| 2002/0017947 A1 | 2/2002 | Ooishi et al. | |
| 2002/0041531 A1 | 4/2002 | Tanaka et al. | |
| 2002/0097628 A1 | 7/2002 | Fujisawa et al. | |
| 2002/0122344 A1 | 9/2002 | Takemura et al. | |
| 2003/0001181 A1 | 1/2003 | Leung et al. | |
| 2003/0002353 A1 | 1/2003 | Lee | |
| 2003/0058722 A1 | 3/2003 | Park | |
| 2003/0081484 A1 | 5/2003 | Kobayashi et al. | |
| 2003/0151072 A1 | 8/2003 | Leung et al. | |
| 2003/0185085 A1 | 10/2003 | Kaneko | |
| 2003/0189859 A1 | 10/2003 | Takahashi et al. | |
| 2003/0223261 A1 | 12/2003 | Kato et al. | |
| 2005/0068838 A1 | 3/2005 | Kono et al. | |
| 2005/0117411 A1 | 6/2005 | Koshikawa et al. | |
| 2005/0174873 A1 | 8/2005 | Ferrant et al. | |
| 2005/0280061 A1 | 12/2005 | Lee | |
| 2006/0007612 A1 * | 1/2006 | Lusky et al. | 361/56 |
| 2006/0112321 A1 | 5/2006 | Leung | |
| 2006/0172504 A1 | 8/2006 | Sinitsky et al. | |
| 2006/0273848 A1 | 12/2006 | Yamazaki et al. | |

FOREIGN PATENT DOCUMENTS

| | | |
|---|---|---|
| EP | 0 588 250 A2 | 3/1994 |
| EP | 0 794 497 | 9/1997 |
| EP | 0 942 430 A1 | 9/1999 |
| GB | 2 265 035 | 9/1993 |
| JP | 58048293 | 3/1983 |
| JP | 03289232 | 12/1991 |
| JP | 98-19309 | 5/1998 |
| WO | WO 00/19445 | 4/2000 |

OTHER PUBLICATIONS

IBM Corp. "A 16Mbit Synchronous DRAM," Revised May 1996, p. 1-100.

Johns, David A. & Ken Martin, *Analog Integrated Circuit Design*, John Wiley & Sons, Inc., 1997, Chap. 5, pp. 248-250.

Rambus Inc., Direct Rambus Technology Disclosure, 1997, pp. 1-48.

Ramtron International Corp. "DM2202/2212 EDRAM 1 Mbx4 Enhanced . . . ," pp. 2-17 to 2-33.

NEC Electronics, Inc. "Dynamic CMOS RAM," pp. 6-101 to 6-113.

Infineon Technologies, "HYB/E 25L128160AC, 128-Mbit Mobile-RAM," Dec. 2001.

MoSys, Inc. "MD904 to MD920 . . . ," 1996, DS01-2.4, Feb. 21. 1997.

Infineon Technologies, "Mobile RAM," Application Note, V1.1, Feb. 2002, pp. 1-7.

Intel Corp. "Pentium Processor 3.3V Pipelined BSRAM Specification," Ver. 2.0, May 25, 1995.

SLDRAM Consortium, "400 Mb/s/pin SLDRAM," pp. 1-59.

Toshiba MOS Digital Integrated Circuit, Sep. 2, 1996.

* cited by examiner

WORD LINE DRIVER FOR DRAM EMBEDDED IN A LOGIC PROCESS

RELATED APPLICATIONS

The present application is a divisional of Ser. No. 11/166,856 filed Jun. 24, 2005 now U.S. Pat. No. 7,274,618.

The present application is also related to U.S. Pat. No. 6,028,804 by Wingyu Leung, entitled "Method and Apparatus for 1-T SRAM Compatible Memory"; U.S. Pat. No. 6,573,548 B2 by Wingyu Leung and Fu-Chieh Hsu, entitled "DRAM cell Having a Capacitor Structure Fabricated Partially in a Cavity and Method for Operating the Same"; U.S. Pat. No. 6,147,914 by Wingyu Leung and Fu-Chieh Hsu, entitled "On-Chip Word Line Voltage Generation for DRAM Embedded in Logic Process"; and U.S. Pat. No. 6,075,720 by Wingyu Leung and Fu-Chieh Hsu, entitled "Memory Cell for DRAM Embedded in Logic". These patents are hereby incorporated by reference in their entirety.

1. Field of the Invention

The present invention is applicable to Dynamic Random Accessible Memory (DRAM). More particularly, this invention relates to DRAM fabricated using a logic compatible process. This invention further relates to the on-chip generation of precision voltages for the operation of DRAM embedded or fabricated using a process compatible to conventional logic process.

2. Related Art

Figure 1:
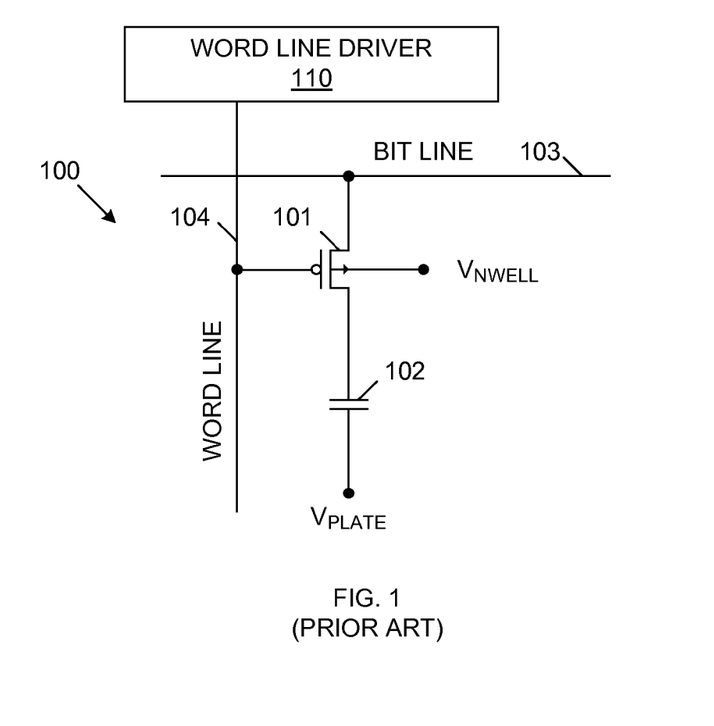
FIG. 1 is a schematic diagram of a DRAM cell, which is fabricated using a conventional logic process.

FIG. 1 is a schematic diagram of a DRAM cell 100, which is fabricated using a conventional logic process. As used herein, a conventional logic process generally refers to a process that uses one layer of conductive gate material.

DRAM cell 100 includes a pass-gate p-channel MOS transistor 101 and a storage capacitor 102. The source of transistor 101 is coupled to bit line 103, the gate of transistor 101 is coupled to word line 104, and the drain of transistor 101 is coupled to the electrode of storage capacitor 102. The counter-electrode of storage capacitor 102 is coupled to receive plate voltage $V_{PLATE}$. Transistor 101 is fabricated in an n-type well region, which is coupled to receive the control voltage $V_{NWELL}$. The n-type well region is located in a p-type substrate.

In DRAM cell 100, data is represented by the charge stored in the cell capacitor 102. During memory access, charge stored in capacitor 102 is discharged to bit line 103. Therefore, the charge needs to be restored to capacitor 102 at the end of a memory access. The operation wherein charge or data is restored to the DRAM cell 100 is called charge or data restore.

The storage capacitor 102 can be formed by a metal-insulator-metal (MIM) structure, such as described in U.S. Patent Application Publication No. US2005/0082586 A1 by Kuo-Chi Tu et al., entitled "MIM Capacitor Structure and Method of Manufacture". Storage capacitor 102 can also be a planar MOS device, such as described in U.S. Pat. No. 6,075,720. Storage capacitor 102 can also be implemented by a folded MOS device, such as described in U.S. Pat. No. 6,573,548 B2.

The MIM capacitor structure, the planar MOS capacitor structure and the folded MOS capacitor structure can all be fabricated using a conventional logic process. These capacitor structures share the following common characteristics. First, there is only one insulating layer between the capacitor electrode and counter-electrode. Second, each these capacitor structures exhibits a capacitance of about 1.5 to 10 femto-Farads (fF), which is significantly smaller than the capacitance of a standard DRAM cell.

Note that standard DRAM cells, which differ from DRAM cell 101, are not fabricated using a conventional logic process. Rather, standard DRAM cells are fabricated using specialized processes, in which multiple polysilicon layers and/or deep trenches are used to form the capacitor structure of the DRAM cell. These specialized processes result in storage capacitors having capacitances greater than 20 fF.

Because capacitor structure 102 exhibits a smaller capacitance than the capacitor of a standard DRAM cell, it is critical to minimize the charge leakage of DRAM cell 100. The charge stored in capacitor 102 can leak through pass-gate transistor 101 due to sub-threshold leakage. The charge stored in capacitor 102 can also leak through the gate oxide of the pass-gate transistor 101. In addition, the charge stored in capacitor 102 can leak through the p-n junction which exists between the p-type drain of transistor 101 (which is continuous with the p-type electrode of capacitor 102), and the n-type well region.

Gate oxide leakage becomes significant when the gate oxide of transistor 101 has a thickness less than 22 Angstroms (Å). To avoid significant gate leakage current through the gate oxide of the pass-gate transistor 101 or the storage capacitor 102, a gate oxide thickness of 22 Å or thicker is used. Sub-threshold leakage is much higher than the junction leakage or the gate oxide leakage. This is especially true for logic processes with feature sizes of 0.13 um or smaller in which the threshold voltage Vth of pass-gate transistor 101 is 0.6 Volts or less. Sub-threshold leakage current can be minimized by reverse biasing the pass-gate transistor 101. Such a scheme is described in U.S. Pat. No. 6,075,720. In this scheme, the word line voltage (i.e., the voltage imposed on the gate of the pass-gate transistor 101) is boosted to the positive supply voltage $V_{DD}$ plus a voltage $V_{delta}$, which is less than the absolute value of the threshold voltage of the p-channel pass-gate transistor 101. If the pass-gate transistor 101 were an N-channel transistor, the word line voltage would be boosted to a negative voltage $V_{delta}$, which has an absolute value less than the threshold voltage of the pass gate transistor. In both cases, $V_{delta}$ represents the magnitude of reverse bias imposed on the gate of the pass-gate transistor 101 to turn the transistor off harder so as to reduce the sub-threshold leakage.

Figure 2:
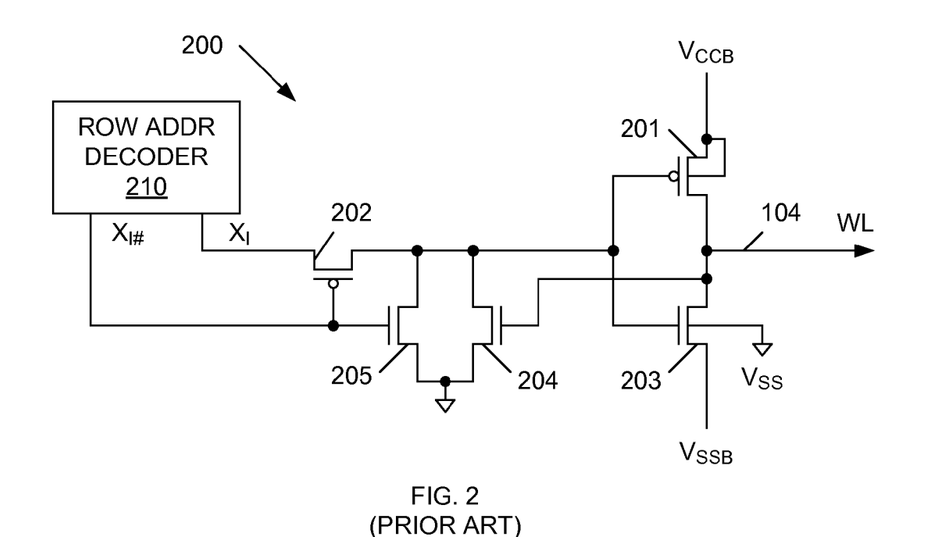
FIG. 2 is a circuit diagram of conventional word line driver circuit.

FIG. 2 is a circuit diagram of word line driver circuit 200 described by U.S. Pat. No. 6,075,720. Word line driver circuit 200 includes p-channel transistors 201-202, n-channel transistors 203-205 and row address decoder 210. Word line driver circuit 200 selectively routes a boosted positive supply voltage $V_{CCB}$ (i.e., $V_{DD}+V_{delta}$) or a boosted negative supply voltage $V_{SSB}$ (i.e., $-V_{delta}$) to word line 104 in response to an address received by row address decoder 210.

The data retention time of memory cell 100 is dependent on the charge stored in capacitor 102. The larger the voltage applied across storage capacitor 102, the larger the amount of charge by the capacitor, and thus the longer it takes for the charge to leak away. When memory cell 101 is accessed, the voltage on word line 104 is boosted to a negative voltage below ground ($V_{SSB}$). This negative voltage ($V_{SSB}$), however, is limited to a value less than a junction voltage below ground. This is because the substrate of NMOS word line driver transistor 203 is connected to ground ($V_{SS}$). In this case, any $V_{SSB}$ voltage equal to or more negative than a p-n junction voltage below ground will cause the p-n junction at the source of the NMOS transistor 203 to turn on, thereby clamping the $V_{SSB}$ voltage to a value equal to a p-n junction voltage below ground.

It is therefore desirable to have a word line driver which can drive word line 104 lower than a p-n junction voltage below ground during data restore, when the pass gate transistor absolute threshold voltage is larger than the p-n junction voltage, thereby increasing the charge stored in DRAM cell 100.

Standard DRAM cells having a PMOS pass-gate transistor may also have their word line boosted below ground during data restore. Such a device is described in "A 20-ns 128-kbitx4 High-Speed DRAM with 330-Mbit/s Data Rate", by Nicky C. C. Lu et al, IEEE JSSC, vol. 23, No. 5. In this scheme, the substrate of the memory device is biased to −2.5 Volts to avoid p-n junction turn-on. The word line negative boosted voltage is generated during a memory access, after the word line is activated. This multiple stage word line activation increases the memory cycle time.

In addition, the word line boosted generator circuit is separated from the substrate bias generator. To avoid junction turn-on, the substrate bias voltage is boosted negatively to a voltage close to the word line negative boosted voltage. This scheme however cannot be readily applied to general logic circuits, as logic circuits, in general, are designed with the substrate grounded.

Accordingly, one objective of this invention is to provide a word line driver in a DRAM embedded in a conventional logic process, wherein the word line driver can couple a negative boosted voltage to the word line, the negative boosted voltage having a value equal to or more than an absolute value of the threshold voltage of the pass-gate transistor below the negative supply (ground). Another objective is to have the word line driver couple a positive boosted voltage to the word line, wherein the positive boosted voltage has a value more positive than the supply voltage $V_{DD}$, so that the sum of the GIDL and subthreshold leakage of the pass gate transistor is substantially minimized.

SUMMARY

Accordingly, the present invention provides a word line driver circuit for accessing a memory cell embedded in a conventional logic process. In one embodiment, the memory cell includes a p-channel pass-gate transistor coupled to a cell capacitor. The word line driver includes an output driver, which is coupled to the gate of the p-channel pass-gate transistor by a word line. The output driver includes an n-channel transistor, which is fabricated in a p-type well region. The p-type well region, in turn, is located in a deep n-type well region. The deep n-type well region, in turn, is located in a p-type semiconductor substrate. The deep n-well is coupled to a voltage equal to or higher than ground. The p-type substrate is coupled to receive the ground supply voltage.

The drain of the n-channel transistor is coupled to the gate of the p-channel access transistor by the word line. A negative boosted voltage is applied to the source of the n-channel transistor and the p-type well region. The negative boosted voltage is less than the ground supply voltage by an amount equal to or greater than the threshold voltage of the p-channel pass-gate transistor.

When the n-channel transistor is turned on (in response to a positive boosted voltage), the full negative boosted voltage is applied to the word line and the gate of the p-channel pass-gate transistor. As a result, the p-channel pass-gate transistor is advantageously capable of applying passing a full positive supply voltage ($V_{CC}$) to the cell capacitor. The deep n-well region prevents leakage current from flowing between the p-type substrate and the negative boosted voltage supply. The deep n-well region also allows the bulk of the n-channel transistor (i.e., the p-type well region) to be biased to a voltage lower than the ground voltage applied to the p-type substrate, thereby allowing the n-channel transistor to provide a word line voltage more negative than one transistor threshold voltage below ground.

The output driver also includes a p-channel transistor, which is fabricated in an n-type well region. The drain of the p-channel transistor is coupled to the gate of the p-channel access transistor by the word line. A positive boosted voltage is applied to the source of the p-channel transistor and the n-type well region. The positive boosted voltage is greater than the positive supply voltage $V_{CC}$ by an amount $V_A$, which usually has a value less than the sub-threshold voltage of the p-channel pass-gate transistor.

When the p-channel transistor is turned on (in response to the negative boosted voltage), the positive boosted voltage is applied to the word line and the gate of the p-channel pass-gate transistor. Under these conditions, the p-channel pass-gate transistor is turned off. The positive boosted voltage is selected to minimize the sum of the sub-threshold leakage and gate-induced-drain-lowering (GIDL) leakage of the p-channel pass-gate transistor. In one embodiment, $V_A$ is chosen to have a value between 0.2 Volts and $V_{TH}$, where $V_{TH}$ is the absolute value of the threshold voltage of the p-channel pass-gate transistor.

In an alternate embodiment, the p-channel transistor is fabricated in the n-well region, on top of the deep n-well region. In this embodiment, the deep n-well region and the n-well region are common electrically and they are coupled to receive the positive boosted voltage.

In another embodiment of the present invention, the conductivity types of the various elements can be reversed, and the characteristics of the positive and negative boosted voltages can be reversed.

The present invention will be more fully understood in view of the following drawings and description.

DETAILED DESCRIPTION

Figure 3:
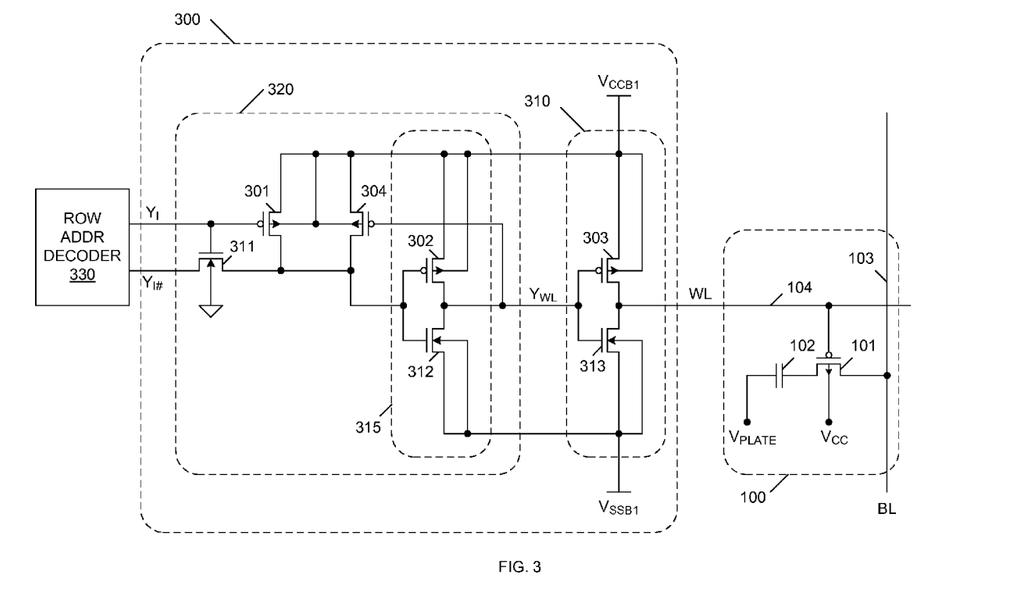
FIG. 3 is a circuit diagram of a word line driver in accordance with one embodiment of the present invention.

FIG. 3 is a circuit diagram of a word line driver 300 in accordance with one embodiment of the present invention. In this embodiment, word line driver 300 drives the word line 104 of embedded DRAM cell 100 (FIG. 1) in response to control signals $Y_I$ and $Y_{I\#}$ provided by a row address decoder 330.

As described above in connection with FIG. 1, DRAM cell 100 is fabricated using a conventional logic process. DRAM cell 100 includes PMOS pass gate transistor 101 and cell capacitor 102. Cell capacitor 102 can be formed, for example, by a metal-insulator-metal (MIM) structure, as described in U.S. Patent Application Publication No. US2005/0082586 A1; a planar MOS device as described in U.S. Pat. No. 6,075,720; or a folded MOS device as described in U.S. Pat. No. 6,573,548 B2. Other capacitor structures compatible with a conventional logic process can be used to implement cell capacitor 102 in other embodiments.

As described above in connection with FIG. 1, DRAM cell 100 is designed to implement a DRAM embedded in logic process. As a result, cell capacitor 102 has a significantly smaller storage capacitance (approximately 1.5 to 10 fF) than a standard DRAM cell (more than 20 fF). The small storage capacitance of cell capacitor 102 necessitates the use of short bit lines (e.g., bit line 103). The short bit lines minimize the bit line capacitive loading and enable the generation of a sufficiently large bit-line signal for data sensing during memory accesses (read, write or refresh operation). In accordance with one embodiment, there are less than or equal to 64 rows in a DRAM array, thereby limiting the bit line length. The gate of PMOS transistor 101 is coupled to receive the word line signal WL provided by word line driver 300 on word line 104.

Word line driver 300 includes output driver 310 and voltage translation circuit 320. Output driver 301 is implemented by an inverter that includes p-channel transistor 303 and n-channel transistor 313. The source and bulk of p-channel transistor 303 are coupled to receive a positive boosted voltage $V_{CCB1}$ from a positive boosted voltage supply. The source and bulk of n-channel transistor 313 are coupled to receive a negative boosted voltage $V_{SSB1}$ from a negative boosted voltage supply. The drains of transistors 303 and 313 are commonly coupled to create an output terminal of output driver 301. This output terminal is coupled to word line 104, thereby applying a word line voltage WL to the gate of p-channel pass-gate transistor 101. The gates of transistors 303 and 313 are commonly coupled to create an input terminal of output driver 301.

Voltage translation circuit 320 includes inverter 315, n-channel transistor 311, and p-channel transistors 301 and 304. Inverter 315, which is implemented by p-channel transistor 302 and n-channel transistor 312, has the same configuration as output driver 310. The output of inverter 315 provides a word line control signal $Y_{WL}$ to the input terminal of output driver 310 and to the gate of p-channel transistor 304.

P-channel transistors 301 and 304 are connected in parallel between the positive boosted voltage supply and the input of inverter 315. The bulk regions of p-channel transistors 301 and 304 are coupled to the positive boosted voltage supply. The gate of p-channel transistor 301 is coupled to receive the control signal $Y_I$ from row address decoder 330.

The gate and source of n-channel transistor 311 are coupled to receive the control signals $Y_I$ and $Y_{I\#}$ respectively, from row address decoder 330. The bulk of n-channel transistor 311 is coupled to the ground voltage supply ($V_{SS}$).

Figure 4A:
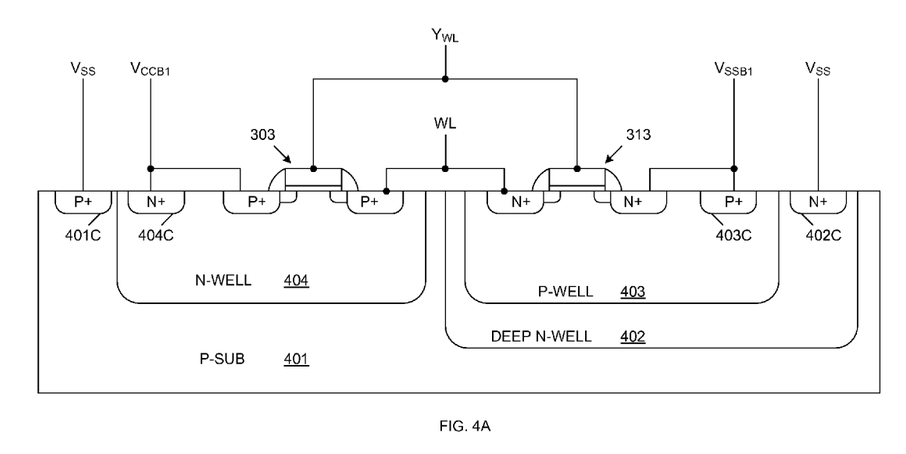
FIG. 4A is a cross sectional view of a p-channel transistor and an n-channel transistor used in the word line driver of FIG. 3, in accordance with one embodiment of the present invention.

FIG. 4A is a cross sectional view of p-channel transistor 303 and n-channel transistor 313. Field dielectric regions are not shown in FIG. 4 for clarity. N-channel transistor 313 is formed in a p-type well region 403, which in turn, is located in a deep n-type well type region 402. Deep n-well region 402, in turn, is located in p-type substrate 401. P-channel transistor 303 is formed in n-type well region 404, which in turn, is located in p-type substrate 401. P-type contact regions 401C and 403C are formed in p-type substrate 401 and p-well region 403, respectively. N-type contact regions 402C and 404C are formed in deep n-well region 402 and n-well region 404, respectively. The N-type contact region 402C is coupled to a voltage equal to or higher than ground, such that the deep n-well 402 is biased at a voltage equal to or higher than the ground supply voltage $V_{SS}$. Similarly, the p-type contact region 401C is coupled to the ground voltage supply, such that the p-type substrate 401 is biased at the ground supply voltage $V_{SS}$.

N-channel transistor 312 can be fabricated in p-type well region 403 in one embodiment of the present invention. In another embodiment, n-channel transistor 312 can be fabricated in another p-type well region (not shown), which is also located in deep n-well 402. In yet another embodiment, n-channel transistor 312 can be fabricated in a separate p-type well region (not shown), which is located in a separate deep n-well (not shown), which is also biased at the ground supply voltage $V_{SS}$.

Note that n-channel transistor 311 is not fabricated in p-well region 403. Rather, this transistor 311 is fabricated in a separate p-well region (not shown), which is located in p-type substrate 401 (but which is not located in a deep n-well region). The p-well region in which transistor 311 is fabricated is coupled to receive the ground supply voltage $V_{SS}$. In another embodiment, transistor 311 is fabricated also in p-well region 403 with the p-well biased at $V_{SSB1}$. Alternatively, transistor 311 can be fabricated in a separate p-well, which is on top of deep n-well 402. N-channel logic transistors fabricated on the same chip as word line driver 300 are typically formed in p-type well regions which are not located in a deep n-well region.

P-channel transistors 301, 302 and 304 can all be fabricated in n-type well region 404 in one embodiment of the present invention. Alternately, p-channel transistors 301, 302 and 304 can all be fabricated in different n-well regions.

Figure 4B:
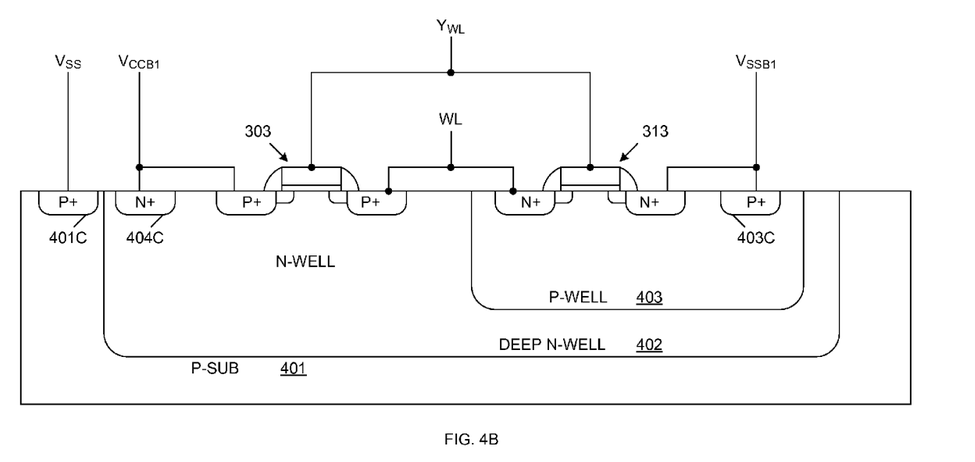
FIG. 4B is a cross sectional view of a p-channel transistor and an n-channel transistor used in the word line driver of FIG. 3, in accordance with another embodiment of the present invention.

FIG. 4B is a cross sectional view of p-channel transistor 303 and n-channel transistor 313 in accordance with an alternate embodiment. In this embodiment, n-type well region 404 is merged with deep n-well 402. In this case, deep n-well 402 is coupled to receive the positive boosted voltage $V_{CCB1}$. This makes the layout of the p-channel transistors smaller, as the separation between the deep n-well and the n-well is eliminated. The result is illustrated in FIG. 4B.

As described in more detail below, word line driver 300 applies the positive boosted voltage $V_{CCB1}$ to word line 104 when DRAM cell 100 is not accessed. Conversely, word line driver 300 applies the negative boosted voltage $V_{SSB1}$ to word line 104 when DRAM cell 100 is accessed.

In the described embodiment, the positive boosted voltage $V_{CCB1}$ is equal to the positive supply voltage $V_{CC}$ plus a voltage $V_A$, wherein $V_A$ is the reverse gate-bias that suppresses the sub-threshold leakage of pass-gate transistor 101. In general, the higher the reverse gate bias, the smaller the sub-threshold leakage of transistor 101. However, if the reverse gate bias becomes too high, significant leakage may be caused by gate-induced-drain-lowering (GIDL). It is therefore desirable to select $V_A$ to have a value such that the sum of the sub-threshold leakage and the GIDL leakage of the pass gate transistor 101 is substantially minimized. In the present embodiment, $V_A$ is chosen to have a value between 0.2 Volts and $V_{TH}$, where $V_{TH}$ is the absolute value of the threshold voltage of pass-gate transistor 101.

In the present embodiment, the negative boosted voltage $V_{SSB1}$ has a voltage that is more negative than one threshold voltage drop ($V_{TH}$) below ground. In the described embodiment, both the positive boosted voltage $V_{CCB1}$ and the negative boosted voltage $V_{SSB1}$ are generated on chip. For example, $V_{CCB1}$ and $V_{SSB1}$ can be generated using charge pump circuits similar those shown in FIGS. 8, 9B, and 10 of U.S. Pat. No. 6,147,914, entitled "On-Chip Word Line Voltage Generation for DRAM Embedded in Logic Process", by Leung et al.

Each of transistors 301-304 and 311-313 of word line driver 300 has a gate dielectric thickness similar to the gate dielectric thickness of pass-gate transistor 101 of the memory cell 100. This gate dielectric thickness is generally thicker than the gate dielectric thickness of the logic transistors fabricated on the same chip, particularly in processes with feature sizes of 0.13 microns or smaller. In one embodiment, transistors 101, 301-304 and 311-314 have a gate dielectric thickness of about 27 Å or more, and the logic transistors have a gate dielectric thickness of about 22 Å. Note that the thicker gate dielectric is available in a conventional logic process, and is typically used to fabricate transistors in the input/output (I/O) region of the chip. The thicker gate dielectric allows the transistors of word line driver 300 and memory cell 100 to handle the higher voltages imposed by the positive boosted voltage $V_{CCB1}$ and the negative boosted voltage $V_{SSB1}$.

When memory cell 100 is not being accessed, PMOS transistor 303 is turned on, thereby coupling the on-chip positive boosted voltage $V_{CCB1}$ to word line 104. When memory cell 100 is being accessed, NMOS transistor 313 is turned on, thereby coupling the on-chip negative boosted voltage $V_{SSB1}$ to word line 104.

Voltage translation circuit 320 is coupled to receive small swing signals $Y_I$-$Y_{I\#}$ from row address decoder 330. The small swing signals $Y_I$-$Y_{I\#}$, which vary from a low voltage of ground ($V_{SS}$) to a high voltage of $V_{CC}$, have a signal swing equal to $V_{CC}$. As described above, output driver 310 has a relatively large output voltage swing of $V_{CCB1}$ to $V_{SSB1}$. Translation circuit 320 translates the small swing signals $Y_I$-$Y_{I\#}$ received from row address decoder 330 into a large swing signal $Y_{WL}$, which varies between $V_{CCB1}$ and $V_{SSB1}$. This large swing signal $Y_{WL}$ is provided to the input terminal of output driver 310. Providing the large swing signal $Y_{WL}$ to output driver 310 advantageously prevents DC current from flowing in output driver 310.

The operation of word line driver 300 will now be described. When memory cell 100 is not being accessed, row address decoder 330 couples the $Y_I$ terminal to the ground voltage supply ($V_{SS}$). The ground potential of the $Y_I$ signal causes NMOS transistor 311 to turn off, and causes PMOS transistor 301 to turn on, thereby applying the positive boosted voltage $V_{CCB1}$ to the input terminal of inverter 315, which is formed by PMOS transistor 302 and NMOS transistor 312. NMOS transistor 312 is turned on in response to the positive boosted voltage $V_{CCB1}$, thereby pulling the down the $Y_{WL}$ signal provided at the output of voltage translation circuit 320 to the negative boosted voltage $V_{SSB1}$. PMOS transistor 302 is strongly turned off in response to the applied positive boosted voltage $V_{CCB1}$, such that no direct current flows through the inverter 315 formed by transistors 302 and 312, other than the sub-threshold leakage currents.

Within output driver 310, NMOS transistor 313 is turned off in response to the negative boosted voltage $V_{SSB1}$ applied to terminal $Y_{WL}$. As a result, no direct current flows through the output driver 310, other than the sub-threshold leakage currents. PMOS transistor 303 is turned on in response to the negative boosted voltage $V_{SSB1}$ applied to the $Y_{WL}$ terminal. As a result, word line 104 is pulled up to the positive boosted voltage $V_{CCB1}$ by PMOS transistor 303. The positive boosted voltage $V_{CCB1}$ on word line 104 is applied to the gate of PMOS access transistor 101 in memory cell 100, thereby turning off this transistor 101. As described above, the positive boosted voltage $V_{CCB1}$ is selected to minimize charge leakage from capacitor 102.

PMOS transistor 304 is also turned on in response to the negative boosted voltage $V_{SSB1}$ applied to the $Y_{WL}$ terminal, thereby helping to pull up the voltage on the input terminal of inverter 315 to the $V_{CCB1}$ voltage.

When memory cell 100 is not being accessed, row address decoder 330 couples the $Y_{I\#}$ terminal to a voltage that is not less than the ground voltage supply ($V_{SS}$). As a result, NMOS transistor 311 is turned off, such that no direct current flows through this transistor 311. Consequently, other than sub-threshold or junction leakages, there is no direct current flow in word line driver 300 when memory cell 100 is not being accessed. Advantageously, power is conserved under these conditions.

When memory cell 100 is being accessed (i.e., during a read, write or refresh operation), row address decoder 330 couples the $Y_I$ terminal to the $V_{CC}$ supply voltage, and couples the $Y_{I\#}$ terminal to the ground voltage supply ($V_{SS}$). The positive boosted voltage $V_{CCB1}$ applied to the source of PMOS transistor 301 is greater than the positive supply voltage $V_{CC}$ applied to the gate of PMOS transistor 301 by a voltage that is less than the threshold voltage $V_{TH}$ of PMOS transistor 301. As a result, PMOS transistor 301 is turned off under these conditions.

NMOS transistor 311 is strongly turned on in response to the positive supply voltage $V_{CC}$ applied to the $Y_I$ terminal. As a result, the input terminal of inverter 315 is pulled down toward the ground supply voltage $V_{SS}$ through NMOS transistor 311. It is important to note that PMOS transistor 304 is designed to have a relatively weak drive with respect to transistors 301-303 and 311-313. This difference in drive strength can be accomplished by designing the channel width of PMOS transistor 304 to be smaller than the channel widths of transistors 301-303 and 311-313. In one embodiment, PMOS transistor 304 is designed to have a drive strength at least 3 times weaker than the drive strength of NMOS transistor 311. As a result, NMOS transistor 311 pulls the input terminal of inverter 315 down to a logic low state, despite the fact that PMOS transistor 304 is simultaneously attempting to pull this voltage up toward the positive boosted voltage $V_{CCB1}$.

In response to the logic low voltage applied to the input terminal of inverter 315, PMOS transistor 302 turns on (and NMOS transistor 312 turns off), thereby coupling the $Y_{WL}$ terminal to the positive boosted voltage $V_{CCB1}$. As a result, the positive boosted voltage $V_{CCB1}$ is applied to the gate of PMOS transistor 304, thereby turning this transistor off, and enabling the input terminal of inverter 315 to be pulled all the way down to the ground supply voltage.

The positive boosted voltage $V_{CCB1}$ on the $Y_{WL}$ terminal is also provided to the input terminal of output driver 310 (i.e., to the gates of transistors 303 and 313). As a result, NMOS transistor 313 is turned on, and PMOS transistor 303 is turned off, such that word line 104 is pulled down to the negative boosted voltage $V_{SSB1}$ by NMOS transistor 313. The negative boosted voltage $V_{SSB1}$ on word line 104 is applied to the gate of PMOS pass-gate transistor 101 in memory cell 100, thereby turning on this transistor 101, and enabling access to memory cell 100.

It is important to note that the voltage on word line 104 can be pulled all the way down to the negative boosted voltage $V_{SSB1}$ because the bulk of NMOS transistor 313 (i.e., p-well region 403 of FIG. 4) is isolated from p-type substrate 401 by deep N-well 402. Thus, the p-well 403 can be biased to the negative boosted voltage $V_{SSB1}$. Because deep n-well 402 is coupled to a voltage equal to ground or higher, and p-type substrate 401 is coupled to the ground supply voltage $V_{SS}$, none of the p-n junctions defined by p-well 403, deep n-well 402 and p-type substrate 401 are forward biased, thereby limiting the substrate current. This is especially true in the alternate configuration of FIG. 4B, wherein the deep n-well 402 replaces (or is merged with) n-well 404, and is coupled to receive the positive boosted voltage $V_{CCB1}$. When the full negative boosted voltage $V_{SSB1}$ is applied to the gate of pass-gate transistor 101, the full voltage applied on the bit line 103 is also applied to the electrode of cell capacitor 102, thereby maximizing the charge stored on cell capacitor 102. This advantageously improves the data retention of memory cell 100.

When memory cell 100 is being accessed, no direct current flows through transistors 301-304 and 311-313. Consequently, other than sub-threshold or junction leakages, there is no direct current flow in word line driver 300 when memory cell 100 is being accessed. Advantageously, power is conserved under these conditions.

Figure 5:
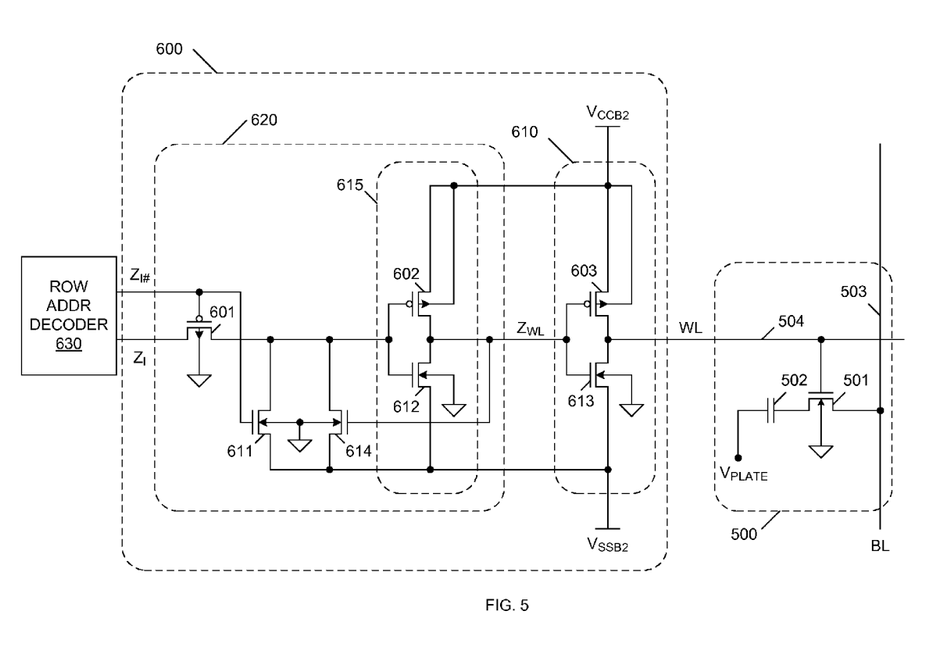
FIG. 5 is a circuit diagram of a word line driver in accordance with an alternate embodiment of the present invention.

FIG. 5 is a circuit diagram of a word line driver 600 in accordance with an alternate embodiment of the present invention. In this embodiment, memory cell 100 (which includes p-channel pass-gate transistor 101) is replaced with a memory cell 500 having an n-channel pass-gate transistor 501. Memory cell 500 also includes cell capacitor 502, bit line 503 and word line 504. Word line driver 600 drives the word line 504 of embedded DRAM cell 500 in response to control signals $Z_I$ and $Z_{I\#}$ provided by row address decoder 630.

The positive and negative boosted voltages $V_{CCB1}$ and $V_{SSB1}$ provided for use with memory cell 100 are modified in the present embodiment. These modifications are required because the pass gate transistor 501 of memory cell 500 is an n-channel device. The positive boosted voltage used in the present embodiment is labeled $V_{CCB2}$, while the negative boosted voltage is labeled $V_{SSB2}$.

In the present embodiment, the positive boosted voltage $V_{CCB2}$ is greater than the positive supply voltage $V_{CC}$ by at least the threshold voltage ($V_{THN}$) of n-channel pass transistor 501. Thus, when the positive boosted voltage $V_{CCB2}$ is applied to the gate of n-channel pass transistor 501, the full $V_{CC}$ supply voltage can be applied to the electrode of capacitor 502.

In the described embodiment, the negative boosted voltage $V_{SSB2}$ is equal to the ground supply voltage $V_{SS}$ minus a voltage $V_{A2}$, wherein $V_{A2}$ is the reverse gate-bias that suppresses the sub-threshold leakage of pass-gate transistor 501. In general, the lower the reverse gate bias, the smaller the sub-threshold leakage of transistor 501. However, if the reverse gate bias becomes too low, significant GIDL leakage may occur. It is therefore desirable to select $V_{A2}$ to have a value which will minimize the sum of the sub-threshold leakage and the GIDL leakage of pass-gate transistor 501. In the present embodiment, $V_{A2}$ is chosen to have a value between 0.2 Volts and $V_{THN}$, where $V_{THN}$ is the threshold voltage of pass-gate transistor 501.

In the described embodiment, both the positive boosted voltage $V_{CCB2}$ and the negative boosted voltage $V_{SSB2}$ are generated on chip. For example, $V_{CCB2}$ and $V_{SSB2}$ can be generated using charge pump circuits similar those shown in FIGS. 8, 9B, and 10 of U.S. Pat. No. 6,147,914, entitled "On-Chip Word Line Voltage Generation for DRAM Embedded in Logic Process", by Leung et al.

Word line driver 600 includes output driver 610 and voltage translation circuit 620. Output driver 610 includes p-channel transistor 603 and n-channel transistor 613, which are similar to p-channel transistor 303 and n-channel transistor 313 of output driver 310 (FIGS. 3, 4A and 4B). However, the deep n-well 402 of FIGS. 4A and 4B is not required in word line driver 600. Rather, n-channel transistor 613 is fabricated in a p-type well region which is coupled to receive the ground supply voltage $V_{SS}$.

Voltage translation circuit 620 includes p-channel transistor 601, n-channel transistors 611 and 614, and inverter 615. Inverter 615 includes p-channel transistor 602 and n-channel transistor 612, which are similar to p-channel transistor 302 and n-channel transistor 312 of inverter 315 (FIG. 3). Again, the deep n-well 402 of FIGS. 4A and 4B is not used in word line driver 600. Thus, n-channel transistors 611-612 and 614 are fabricated in a p-type well region (or regions) which are coupled to receive the ground supply voltage $V_{SS}$.

The output terminal of inverter 615 is coupled to the gate of n-channel transistor 614. N-channel transistors 611 and 614 are connected in parallel between the input terminal of inverter 615 and the negative boosted voltage terminal ($V_{SSB2}$). The gate of n-channel transistor 611 is coupled to receive the $Z_{I\#}$ signal from row address decoder 630. The p-type substrate is connected to ground.

The source and gate p-channel transistor 601 are coupled to receive the $Z_I$ and $Z_{I\#}$ signals, respectively. The drain of p-channel transistor 601 is coupled to the input terminal of inverter 615.

Each of transistors 601-603 and 611-614 of word line driver 600 has a gate dielectric thickness similar to the gate dielectric thickness of the pass-gate transistor 501 of memory cell 500 (i.e., the thicker gate dielectric typically used in I/O circuits of the chip). The thicker gate dielectric allows the transistors of word line driver 600 and memory cell 500 to handle the higher voltages imposed by the positive boosted voltage $V_{CCB2}$ and the negative boosted voltage $V_{SSB2}$.

Voltage translation circuit 620 functions similarly to voltage translation circuit 320 (FIG. 3). That is, voltage translation circuit 620 translates the small swing signals $Z_I$ and $Z_{I\#}$ received from row address decoder 630 to large swing signals to drive output driver 610.

As described in more detail below, word line driver 600 couples word line 504 to the positive boosted voltage $V_{CCB2}$ when memory cell 500 is accessed (read, write or refresh). Conversely, word line driver 600 couples word line 504 to the negative boosted voltage $V_{SSB2}$ when memory cell 500 is not being accessed.

The operation of word line driver 600 will now be described. When memory cell 500 is not being accessed, row address decoder 630 couples the $Z_{I\#}$ terminal to the positive voltage supply ($V_{CC}$). The $V_{CC}$ potential of the $Z_{I\#}$ signal causes NMOS transistor 611 to turn on, and causes PMOS transistor 601 to turn off, thereby applying the negative boosted voltage $V_{SSB2}$ to the input terminal of inverter 615. Within inverter 615, PMOS transistor 602 is turned on in response to the negative boosted voltage $V_{SSB2}$, thereby pulling up the $Z_{WL}$ signal provided at the output of voltage translation circuit 620 to the positive boosted voltage $V_{CCB2}$. NMOS transistor 612 is strongly turned off in response to the applied negative boosted voltage $V_{SSB2}$, such that no direct current flows through the inverter 615 formed by transistors 602 and 612.

Within output driver 610, PMOS transistor 603 is turned off in response to the positive boosted voltage $V_{CCB2}$ applied to terminal $Z_{WL}$. As a result, no direct current flows through the output driver 610. NMOS transistor 613 is turned on in response to the positive boosted voltage $V_{CCB2}$ applied to the $Z_{WL}$ terminal. As a result, word line 504 is pulled down to the negative boosted voltage $V_{SSB2}$ by NMOS transistor 613. The negative boosted voltage $V_{SSB2}$ on word line 504 is applied to the gate of NMOS access transistor 501 in memory cell 500, thereby turning off this transistor 501. As described above, the negative boosted voltage $V_{SSB2}$ is selected to minimize charge leakage through the channel of pass gate transistor 501.

NMOS transistor 614 is also turned on in response to the positive boosted voltage $V_{CCB2}$ applied to the $Z_{WL}$ terminal, thereby helping to pull down the voltage on the input terminal of inverter 615 to the $V_{SSB2}$ voltage.

When memory cell 500 is not being accessed, row address decoder 630 couples the $Z_I$ terminal to receive a voltage equal to or less than the positive supply voltage $V_{CC}$. Since the $Z_{I\#}$ is coupled to the positive supply voltage $V_{CC}$, PMOS transistor 601 is turned off, such that no direct current flows through this transistor 601. Consequently, other than sub-threshold or junction leakages, there is no direct current flow in word line driver 600 when memory cell 500 is not being accessed. Advantageously, power is conserved under these conditions.

When memory cell 500 is being accessed (i.e., during a read, write or refresh operation), row address decoder 630 couples the $Z_{I\#}$ terminal to receive the ground supply voltage ($V_{SS}$), and couples the $Z_I$ terminal to receive the positive voltage supply ($V_{CC}$). The negative boosted voltage $V_{SSB2}$ applied to the source of NMOS transistor 611 is more negative than the ground supply voltage $V_{SS}$ applied to the gate of NMOS transistor 611 by a voltage that is less than the threshold voltage $V_{THN}$ of NMOS transistor 611. As a result, NMOS transistor 611 is turned off under these conditions.

PMOS transistor 601 is strongly turned on in response to the ground supply voltage $V_{SS}$ applied to the $Z_{I\#}$ terminal. As a result, the input terminal of inverter 615 is pulled up toward the positive supply voltage $V_{CC}$ through PMOS transistor 601. It is important to note that NMOS transistor 614 is designed to have a relatively weak drive with respect to transistors 601-603 and 611-613. In one embodiment, NMOS transistor 614 is designed to have a drive strength at least 3 times weaker than the drive strength of PMOS transistor 601. As a result, PMOS transistor 601 pulls the input terminal of inverter 615 up to a logic high state, despite the fact that NMOS transistor 614 is simultaneously attempting to pull this voltage down toward the negative boosted voltage $V_{SSB2}$.

In response to the logic high voltage applied to the input terminal of inverter 615, NMOS transistor 612 turns on (and PMOS transistor 602 turns off), thereby coupling the $Z_{WL}$ terminal to the negative boosted voltage $V_{SSB2}$. As a result, the negative boosted voltage $V_{SSB2}$ is applied to the gate of NMOS transistor 614, thereby turning this transistor off, and enabling the input terminal of inverter 615 to be pulled all the way up to the positive supply voltage $V_{CC}$.

The negative boosted voltage $V_{SSB2}$ on the $Z_{WL}$ terminal is also provided to the input terminal of output driver 610 (i.e., to the gates of transistors 603 and 613). As a result, PMOS transistor 603 is turned on, and NMOS transistor 613 is turned off, such that word line 504 is pulled up to the positive boosted voltage $V_{CCB2}$ by PMOS transistor 603. The positive boosted voltage $V_{CCB2}$ on word line 504 is applied to the gate of NMOS pass-gate transistor 501 in memory cell 500, thereby turning on this transistor 501, and enabling access to memory cell 500.

When memory cell 500 is being accessed, no direct current flows through transistors 601-603 and 611-614. Consequently, other than sub-threshold or junction leakages, there is no direct current flow in word line driver 600 when memory cell 500 is being accessed. Advantageously, power is conserved under these conditions.

Note that if the circuit of FIG. 5 is fabricated on an n-type substrate, a deep p-well region could be formed, wherein the p-channel transistors 602 and 603 would be formed in n-type well regions, which in turn, are located in the deep p-well region. Biasing of the n-type substrate and the various well regions could be performed in accordance with the above-described specifications.

Although the invention has been described in connection with several embodiments, it is understood that this invention is not limited to the embodiments disclosed, but is capable of various modifications which would be apparent to a person skilled in the art. Thus, the invention is limited only by the following claims.

I claim:
1. A circuit comprising:
    a memory cell including a p-channel pass-gate transistor coupled to a cell capacitor;
    a word line driver including an n-channel transistor located in a p-type well region, wherein the p-type well region is located in a deep n-type well region;
    a word line coupling a drain of the n-channel transistor to a gate of the p-channel pass-gate transistor; and
    a negative boosted voltage supply configured to provide a negative boosted voltage to the p-type well region and a source of the n-channel transistor, wherein the negative boosted voltage is less than a ground supply voltage by an amount equal to or greater than a threshold voltage of the p-channel pass-gate transistor.
2. The circuit of claim 1, further comprising a positive boosted voltage supply configured to provide a positive boosted voltage to the deep n-type well region.
3. The circuit of claim 1, wherein the word line driver further comprises a p-channel transistor located in an n-type well region, wherein a drain of the p-channel transistor is coupled to the word line.
4. The circuit of claim 3, further comprising a positive boosted voltage supply configured to provide a positive boosted voltage to the n-type well region and a source of the p-channel transistor.
5. The circuit of claim 4, wherein the positive boosted voltage is greater than a positive supply voltage, the positive boosted voltage being selected to substantially minimize the sum of the sub-threshold leakage and GIDL leakage through the p-channel pass-gate transistor.
6. The circuit of claim 1, further comprising a plurality of logic transistors fabricated on the same chip as the memory cell and word line driver.
7. The circuit of claim 1, wherein the cell capacitor has a capacitance of about 10 femto-Farads or less.
8. The word line driver circuit of claim 1, wherein the pass-gate transistor and the n-channel transistor have the same gate dielectric thickness.
9. A circuit comprising:
    a memory cell including a p-channel pass-gate transistor coupled to a cell capacitor;
    a word line driver including an n-channel transistor located in a p-type well region, wherein the p-type well region is located in a deep n-type well region;
    a word line coupling a drain of the n-channel transistor to a gate of the p-channel pass-gate transistor;
    a negative boosted voltage supply configured to provide a negative boosted voltage to the p-type well region and a source of the n-channel transistor; and
    a voltage supply configured to provide a voltage equal to or greater than ground to the deep n-type well region, wherein the deep n-well region is located in a p-type substrate, wherein a ground voltage supply is coupled to the p-type substrate.
10. A circuit comprising:
    a memory cell including a p-channel pass-gate transistor coupled to a cell capacitor;
    a word line driver including an n-channel transistor located in a p-type well region, wherein the p-type well region is located in a deep n-type well region, and a p-channel transistor located in an n-type well region;

a word line coupling a drain of the n-channel transistor and a drain of the p-channel transistor to a gate of the p-channel pass-gate transistor;

a negative boosted voltage supply configured to provide a negative boosted voltage to the p-type well region and a source of the n-channel transistor;

a positive boosted voltage supply configured to provide a positive boosted voltage to the n-type well region and a source of the p-channel transistor; and an inverter having an output terminal coupled to a gate of the p-channel transistor and a gate of the n-channel transistor, wherein the inverter is coupled to receive the positive boosted voltage and the negative boosted voltage.

11. The circuit of claim 10, further comprising a weak p-channel transistor coupled between the positive boosted voltage supply and an input of the inverter.

12. The circuit of claim 11, further comprising means for coupling the input of the inverter to the positive boosted voltage supply or the ground voltage supply.

* * * * *